US009412565B2

(12) United States Patent
Yoshida et al.

(10) Patent No.: US 9,412,565 B2
(45) Date of Patent: Aug. 9, 2016

(54) TEMPERATURE MEASURING METHOD AND PLASMA PROCESSING SYSTEM

(71) Applicant: Tokyo Electron Limited, Tokyo (JP)

(72) Inventors: Yusuke Yoshida, Miyagi (JP); Ryou Son, Miyagi (JP); Takahiro Senda, Miyagi (JP); Masayuki Kohno, Hopewell Junction, NY (US); Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/609,554

(22) Filed: Jan. 30, 2015

(65) Prior Publication Data
US 2015/0221482 A1 Aug. 6, 2015

(30) Foreign Application Priority Data

Feb. 4, 2014 (JP) .................................. 2014-019634

(51) Int. Cl.
| | | |
|---|---|---|
| *H01L 21/302* | (2006.01) | |
| *H01J 37/32* | (2006.01) | |
| *G01J 5/00* | (2006.01) | |
| G01J 5/08 | (2006.01) | |
| G01J 5/06 | (2006.01) | |

(52) U.S. Cl.
CPC ......... *H01J 37/32724* (2013.01); *G01J 5/0007* (2013.01); *G01J 5/0044* (2013.01); *H01J 37/3299* (2013.01); *H01J 37/32522* (2013.01); *H01J 37/32935* (2013.01); *G01J 5/0875* (2013.01); *G01J 2005/0048* (2013.01); *G01J 2005/068* (2013.01)

(58) Field of Classification Search
CPC . G01K 15/005; G01K 17/00; H01J 2237/334; H01J 37/32724; H01J 37/32642; H01J 37/32522; H01J 37/32935; G01J 2005/008

USPC ............ 438/706, 710, 714, 715; 156/345.24, 156/345.27, 345.37, 345.52
See application file for complete search history.

(56) References Cited

U.S. PATENT DOCUMENTS

| | | | | |
|---|---|---|---|---|
| 7,355,715 | B2 * | 4/2008 | Suzuki ................. | G01J 5/0003 356/478 |
| 2008/0170969 | A1 * | 7/2008 | Yoshioka ........... | G05D 23/2229 422/109 |
| 2010/0206482 | A1 * | 8/2010 | Matsudo ............... | G01J 5/0003 156/345.27 |
| 2012/0048467 | A1 * | 3/2012 | Mahadeswaraswamy ................. | H01J 37/32522 156/345.27 |
| 2014/0308028 | A1 | 10/2014 | Mashimo et al. | |

FOREIGN PATENT DOCUMENTS

WO 2013/099063 7/2013

* cited by examiner

*Primary Examiner* — Lan Vinh
(74) *Attorney, Agent, or Firm* — IPUSA, PLLC (57) ABSTRACT

A temperature measuring method for measuring a temperature of a member corresponding to a measuring object arranged within a chamber of a plasma processing apparatus is provided. The temperature measuring method involves obtaining a function (f) for correcting a correction target temperature ($T_{meas}$) according to a measurement window temperature ($T_w$), the function (f) being computed based on the correction target temperature ($T_{meas}$) corresponding to a temperature of the measuring object measured via a measurement window arranged at the chamber, a reference temperature ($T_{obj}$) corresponding to a temperature of the measuring object measured without using the measurement window, and the measurement window temperature ($T_w$) corresponding to a temperature of the measurement window. The temperature measuring method further involves measuring the correction target temperature ($T_{meas}$), measuring the measurement window temperature ($T_w$), and correcting the correction target temperature ($T_{meas}$) according to the measurement window temperature ($T_w$) based on the obtained function (f).

4 Claims, 10 Drawing Sheets

| CORRECTION TARGET TEMPERATURE $x_1 (=T_{meas})$ | WINDOW TEMPERATURE $x_2 (=T_w)$ | REFERENCE TEMPERATURE $y (=T_{obj})$ |
|---|---|---|
| $x_{11}$ | $x_{12}$ | $y_1$ |
| ⋮ | ⋮ | ⋮ |
| $x_{k1}$ | $x_{k2}$ | $y_k$ |
| ⋮ | ⋮ | ⋮ |
| $x_{n1}$ | $x_{n2}$ | $y_n$ |

FIG.6

| No. | CORRECTION TARGET TEMPERATURE $x_1$ | WINDOW TEMPERATURE $x_2$ | REFERENCE TEMPERATURE $y$ |
|---|---|---|---|
| 1 | 15.1 | 34.1 | 30.3 |
| 2 | 35.7 | 34.5 | 33.1 |
| 3 | 51.8 | 34.5 | 35.5 |
| 4 | 18.1 | 47.8 | 40.6 |
| 5 | 37.2 | 47.8 | 42.9 |
| 6 | 53.0 | 47.7 | 44.9 |
| 7 | 19.7 | 61.4 | 51.1 |
| 8 | 38.9 | 61.4 | 53.1 |
| 9 | 56.8 | 61.6 | 55.1 |

TEMPERATURE MEASURING METHOD AND PLASMA PROCESSING SYSTEM

BACKGROUND OF THE INVENTION

The present invention relates to a temperature measuring method and a plasma processing system.

DESCRIPTION OF THE RELATED ART

In a plasma processing apparatus that performs a plasma process such as etching, variations in the temperature of a member arranged within a chamber of the plasma processing apparatus may cause variations in processing results of a plasma process performed on a substrate, for example. Accordingly, techniques are known for monitoring the temperature of a member arranged within the chamber and controlling the temperature of the member to a predetermined temperature (e.g. see International Patent Publication No. WO/2013/099063).

The temperature of a member arranged within the chamber may be measured by various types of thermometers using a contact method or a non-contact method. For example, a radiation thermometer may be used in the case of measuring the temperature of a member using a non-contact method. The radiation thermometer measures radiated light (e.g. infrared light) emitted from a member corresponding to a measuring object arranged within the chamber via a measurement window that is arranged at the chamber and converts the measured amount of radiation into a corresponding temperature.

The amount of radiation measured by the radiation thermometer may vary depending on the temperature of the measurement window and the transparency of the measurement window, for example. Accordingly, when the measurement window does not have adequate transparency and the temperature of the measurement window varies depending on heat input from plasma, measurement errors due to such influences that are included in the temperature measurements of the radiation thermometer cannot be ignored, and it may be difficult to accurately measure the temperature of the member corresponding to the measuring object.

On the other hand, the measurement window is exposed to plasma, and as such, a material that is resistant plasma has to be selected for the measurement window. Thus, restrictions are imposed on the materials that can be used as the measurement window in view of the demands for both adequate transparency and adequate plasma resistance in the measurement window, and it is rather difficult to select a suitable material having adequate transparency without due consideration to the plasma resistance of the material.

SUMMARY OF THE INVENTION

In view of the above, an aspect of the present invention relates to providing a temperature measuring method and a plasma processing system that are capable of accurately measuring the temperature of a member corresponding to a measuring object that is arranged within a plasma processing apparatus via a measurement window.

According to one embodiment of the present invention, a temperature measuring method for measuring a temperature of a member corresponding to a measuring object arranged within a chamber of a plasma processing apparatus is provided. The temperature measuring method includes a function obtaining step of obtaining a function (f) for correcting a correction target temperature ($T_{meas}$) according to a measurement window temperature ($T_w$), the function (f) being computed based on the correction target temperature ($T_{meas}$) corresponding to a temperature of the measuring object measured via a measurement window arranged at the chamber, a reference temperature ($T_{obj}$) corresponding to a temperature of the measuring object measured without using the measurement window, and the measurement window temperature ($T_w$) corresponding to a temperature of the measurement window. The temperature measuring method further includes a first measuring step of measuring the correction target temperature ($T_{meas}$) a second measuring step of measuring the measurement window temperature ($T_w$), and a correction step of correcting the correction target temperature ($T_{meas}$) measured in the first measuring step according to the measurement window temperature ($T_w$) measured in the second measuring step based on the obtained function (f).

According to another embodiment of the present invention, a plasma processing system is provided that includes a plasma processing apparatus and a temperature measuring apparatus for measuring a temperature of a member corresponding to a measuring object arranged within a chamber of the plasma processing apparatus. The temperature measuring apparatus includes a function obtaining unit configured to obtain a function (f) for correcting a correction target temperature ($T_{meas}$) according to a measurement window temperature ($T_w$), the function (f) being computed based on the correction target temperature ($T_{meas}$) corresponding to a temperature of the measuring object measured via a measurement window arranged at the chamber, a reference temperature ($T_{obj}$) corresponding to a temperature of the measuring object measured without using the measurement window, and the measurement window temperature ($T_w$) corresponding to a temperature of the measurement window. The temperature measuring apparatus further includes a measuring unit configured to measure the correction target temperature ($T_{meas}$) and the measurement window temperature ($T_w$), and a correction unit configured to correct the correction target temperature ($T_{meas}$) according to the measurement window temperature ($T_w$) measured by the measuring unit based on the function (f) obtained by the function obtaining unit.

DESCRIPTION OF THE PREFERRED EMBODIMENTS

In the following, embodiments of the present invention are described with reference to the accompanying drawings. Note that in the following descriptions and accompanying drawings, elements having substantially the same functions or features may be given the same reference numerals and overlapping descriptions thereof may be omitted.

[Overall Configuration of Plasma Processing System]

Figure 1:
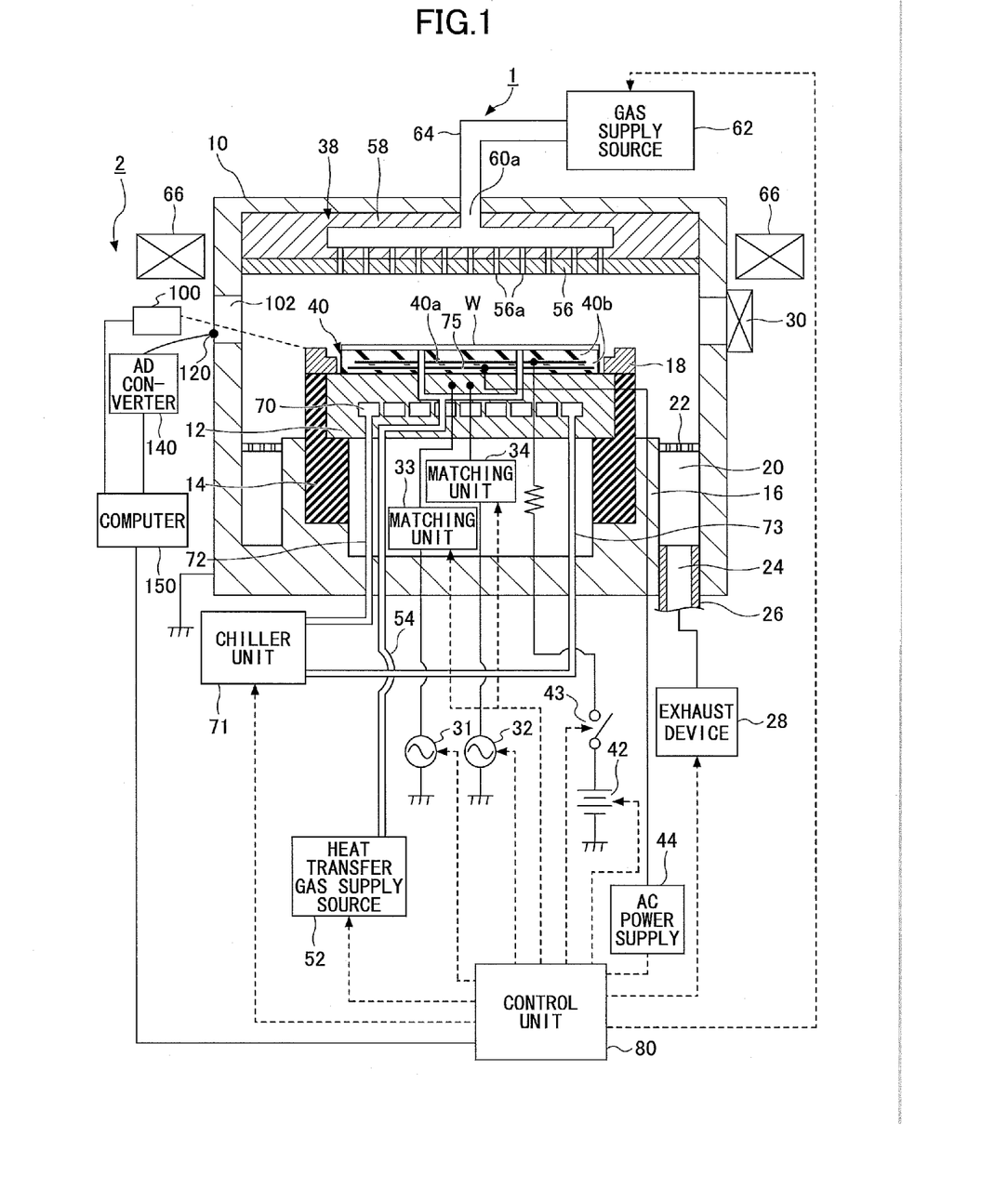
FIG. 1 illustrates an overall configuration of a plasma processing system according to an embodiment of the present invention.

First, overall configurations of a plasma processing apparatus and a plasma processing system according to an embodiment of the present invention are described with reference to FIG. 1. FIG. 1 illustrates exemplary overall configurations of a plasma processing system 2 and a plasma processing apparatus 1 according to an embodiment of the present invention.

Note that in the following descriptions of the present embodiment, a capacitively-coupled plasma etching apparatus is illustrated as an example of the plasma processing apparatus 1. Also, in the following descriptions of the present embodiment, an exemplary case is illustrated in which a radiation thermometer 100 is configured to measure the temperature of a focus ring 18 via a measurement window 102.

The plasma processing system 2 of the present embodiment includes the plasma processing apparatus 1 and a temperature measuring apparatus including a computer 150. The plasma processing apparatus 1 and the temperature measuring apparatus are interconnected via a wireless or wired network.

The plasma processing apparatus 1 includes a cylindrical vacuum chamber (processing chamber) 10 (simply referred to as "chamber" hereinafter) made of aluminum having an alumite-treated (anodized) surface, for example. The chamber 10 may be grounded, for example.

A mounting table 12 is arranged within the chamber 10. The mounting table 12 may be made of aluminum (Al), titanium (Ti), or silicon carbide (SiC), for example, and is supported on a cylindrical support 16 via an insulating cylindrical holder 14. The cylindrical support 16 extends vertically upward from a bottom of the chamber 10.

An exhaust path 20 is formed between a sidewall of the chamber 10 and the cylindrical support 16. A ring-shaped baffle plate 22 is arranged in the exhaust path 20. An exhaust port 24 is formed at a bottom portion of the exhaust path 20 and is connected to an exhaust device 28 via an exhaust pipe 26. The exhaust device 28 includes a vacuum pump such as a turbo-molecular pump or a dry pump (not shown) and is configured to reduce the pressure of a processing space within the chamber 10 to a predetermined level of vacuum. A gate valve 30 configured to open/close an entry/exit port for a semiconductor wafer (referred to as "wafer W" hereinafter) is arranged at the sidewall of the chamber 10.

A first high frequency power supply 31 for plasma excitation is connected to the mounting table 12 via a matching unit 33, and a second high frequency power supply 32 for drawing ions toward the wafer W is connected to the mounting table 12 via a matching unit 34. For example, the first high frequency power supply 31 may be configured to apply to the mounting table 12 a first high frequency power having a frequency that is suitable for generating a plasma within the chamber 10 (e.g. 60 MHz). The second high frequency power supply 32 may be configured to apply to the mounting table 12 a second high frequency power of a lower frequency that is suitable for drawing ions from within the plasma onto the wafer W placed on the mounting table 12 (e.g. 0.8 MHz). In this way, the mounting table 12 is configured to hold the wafer W and also act as a lower electrode.

An electrostatic chuck 40 configured to hold the wafer W by an electrostatic attraction force is arranged on a top surface of the mounting table 12. The electrostatic chuck 40 includes an electrode 40a that is made of a conductive film and is arranged between a pair of insulating layers 40b (or insulating sheets). A DC voltage supply 42 is connected to the electrode 40a via a switch 43. The electrostatic chuck 40 electrostatically attracts and holds the wafer W by a Coulomb force that is generated when a voltage is applied thereto from the DC voltage supply 42. To improve in-plane etching uniformity, a focus ring 18 that may be made of silicon or quartz, for example, is arranged around an outer edge portion of the electrostatic chuck 40.

A shower head 38 that acts as an upper electrode at a ground potential is arranged at a ceiling portion of the chamber 10. In this way, the high frequency power from the first high frequency power supply 31 may be capacitively applied between the mounting table 12 and the shower head 38.

The shower head 38 includes an electrode plate 56 having multiple gas holes 56a and an electrode supporting body 58 configured to detachably hold the electrode plate 56. A gas supply source 62 is configured to supply gas to the shower head 38 via a gas supply pipe 64, which is connected to a gas inlet 60a. In this way, the gas may be introduced into the chamber 10 from the multiple gas holes 56a. A magnet 66 is arranged to extend annularly or concentrically around the chamber 10 so that the plasma generated within a plasma generation space between the upper electrode and the lower electrode may be controlled by the magnetic force of the magnet 66.

A coolant path 70 is formed within the mounting table 12. A coolant cooled to a predetermined temperature is supplied to the coolant path 70 from a chiller unit 71 via pipes 72 and 73. Also, a heater 75 is embedded within the electrostatic chuck 40. Note that the heater 75 may alternatively be attached to a backside surface of the electrostatic chuck 40 instead of being embedded within the electrostatic chuck 40. A desired AC voltage is applied to the heater 75 from an AC power supply 44. A heat transfer gas supply source 52 is configured to supply a heat transfer gas such as He gas between a backside surface of the wafer W and a top surface of the electrostatic chuck 40 through a gas supply line 54.

With such a configuration, the temperature of the wafer W may be adjusted to a desired temperature through cooling by the circulation of a coolant from the chiller unit 71 through the coolant path 70 and heating by the heater 75. Note that such temperature control may be performed based on a command from a control unit 80.

The control unit 80 is configured to control the components arranged in the plasma processing apparatus 1 such as the exhaust device 28, the AC power supply 44, the DC voltage supply 42, the switch 43 for the electrostatic chuck, the first high frequency power supply 31, the second high frequency power supply 32, the matching units 33 and 34, the heat transfer gas supply source 52, the gas supply source 62, and the chiller unit 71.

In the plasma processing apparatus 1, variations in the temperature of a member arranged within the chamber 10 may cause variations in processing results of a plasma process performed on the wafer W. Accordingly, it is important to monitor the temperature of the member arranged within the chamber 10 and control the temperature of the member to a predetermined temperature. In the following descriptions, the focus ring 18 is illustrated as an example of a member corresponding to a measuring object according to the present embodiment.

The radiation thermometer 100 measures the amount of infrared light (an example of radiated light) that is emitted by the focus ring 18 via a measurement window 102 that is arranged at the chamber 10. The computer 150 acquires the measured amount of infrared light and converts the measured amount of infrared light into a corresponding temperature. In this way, the temperature of the focus ring 18 may be calculated.

In FIG. 1, the temperature of the measurement window 102 is measured using a thermocouple 120. The computer 150 acquires the temperature of the measurement window 102 measured by the thermocouple 120, which is attached to the measurement window 102. An AD converter 140 is configured to convert the measured temperature of the measurement window 102 from an analog signal to a digital signal. The computer 150 acquires the digital signal of the temperature of the measurement window 102 after the conversion.

As described below, the computer 150 is configured to correct the temperature of the focus ring 18 measured by the radiation thermometer 100 according to the temperature of the measurement window 102. Note that the computer 150, the radiation thermometer 100, the thermocouple 120, the AD converter 140 are exemplary elements of a temperature measuring apparatus according to the present embodiment. Note that the temperature measuring apparatus according to the present embodiment may include a thermometer other than a radiation thermometer and a thermocouple, for example. Also, the computer 150 may be implemented by a personal computer or some other information processing apparatus, for example.

The control unit 80 acquires the corrected temperature of the focus ring 18 corrected by the computer 150 and controls the temperature within the chamber 10 based on the acquire temperature. The control unit 80 includes a CPU (Central Processing Unit) and a storage area such as a ROM (Read-Only Memory), a RAM (Random Access Memory), and a HDD (Hard Disk Drive), for example (not shown). The CPU is configured to execute processes such as a plasma process on a wafer W and a temperature control process on a member within the chamber 10 according to relevant recipes specifying process procedures and process conditions, for example.

A storage area for storing the recipes may be configured as a RAM or a ROM using a semiconductor memory, a magnetic disk, or an optical disk, for example. The recipes may be stored in a storage medium and loaded in the storage area via a driver (not shown), for example. Alternatively, the recipes may be downloaded from a network (not shown) and stored in the storage area, for example. Also, note that a DSP (digital signal processor) may be used instead of the CPU to perform the above functions. The functions of the control unit 80 may be implemented by software, hardware, or a combination thereof.

[Temperature Measuring Method]

In the following, a temperature measuring method according to an embodiment of the present invention is described with reference to FIG. 2. In the plasma processing apparatus 1, variations in the temperature of a member arranged within the chamber 10 may cause variations in processing results of a plasma process performed on the wafer W. That is, reactions occurring at the interfaces between a plasma and a member arranged within the chamber 10 such as the focus ring 18, the electrode plate 56, or the mounting table 12 may vary depending on the surface temperature of the member. As a consequence, variations may occur in the composition of the plasma to thereby cause variations in processing results of a plasma process performed on the wafer W. In view of the above, the temperature of the member within the chamber 10 is typically monitored such that the temperature of the member may be controlled to a predetermined temperature.

Figure 2:
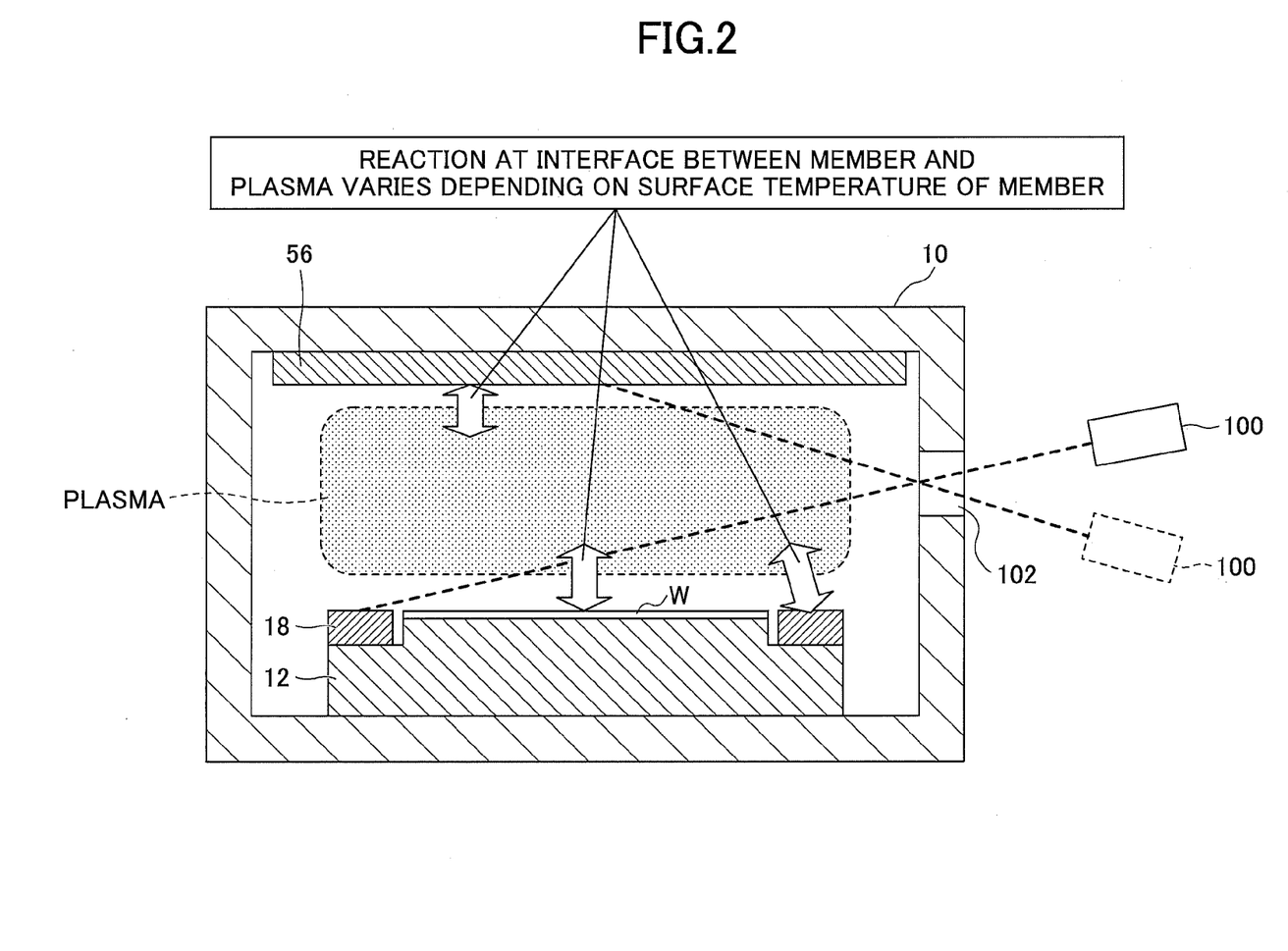
FIG. 2 illustrates a temperature measuring method for measuring the temperature of a member corresponding to a measuring object according to an embodiment of the present invention.

For example, the radiation thermometer 100 of FIG. 2 may measure the amount of radiated light emitted from a member corresponding to a measuring object such as the focus ring 18 or the electrode plate 56 (ceiling member) within the chamber 10 via the measurement window 102. The amount of radiated light measured by the radiation thermometer 100 may vary depending on the temperature of the measurement window 102 and the transparency of the measurement window 102, for example.

Figure 3:
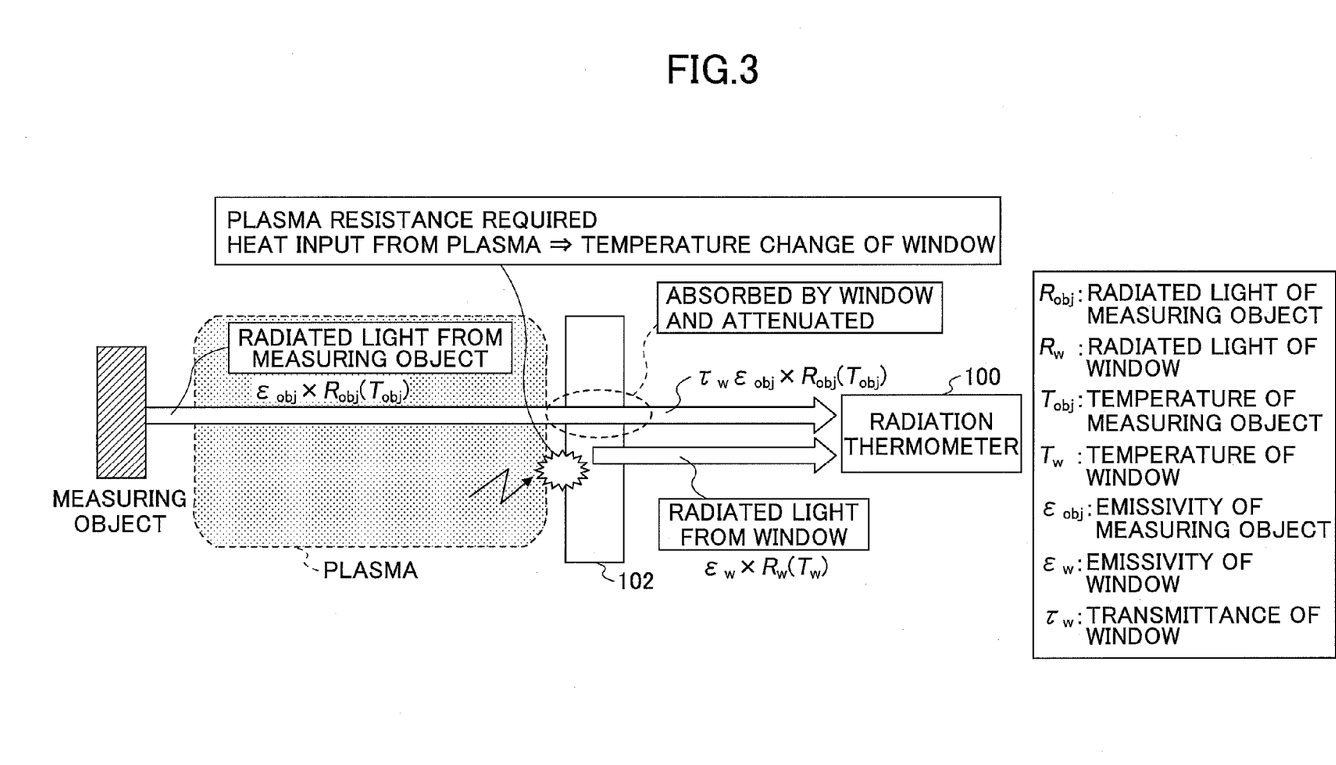
FIG. 3 illustrates the influence of a window temperature on temperature measurement by a radiation thermometer according to an embodiment of the present invention.

The above effect is described in greater detail with reference to FIG. 3. As illustrated in FIG. 3, the intensity of radiated light emitted from a member corresponding to a measuring object may be expressed as follows:

$$\epsilon_{obj} \times R_{obj}(T_{obj})$$

In the above expression, $\epsilon_{aj}$ represents the emissivity of the measuring object, $R_{obj}$ represents the intensity of black body radiation at the temperature $T_{obj}$ of the measuring object. The intensity $R_{obj}$ of black body radiation at the temperature $T_{obj}$ is a function of the temperature $T_{obj}$ of the measuring object Tobj member, and may be expressed as $R_{obj}(T_{obj})$.

The intensity of the radiated light emitted light from the measuring object is absorbed by the measurement window 102 and is attenuated upon passing through the measurement window 102. The intensity of the radiated light after attenuation may be expressed as follows:

$$\tau_w \epsilon_{obj} \times R_{obj}(T_{obj}).$$

In the above expression, $\tau_w$ represents the transmittance of the measurement window 102.

Also, an intensity of radiated light from the measurement window 102 is generated separately from the intensity of the radiated light described above, and the intensity of the radiated light from the measurement window 102 may be expressed as follows:

$$\epsilon_w \times R_w(T_w)$$

In the above expression, $\epsilon_w$ represents the emissivity of the measurement window 102, $R_w$ represents the intensity of black body radiation at the temperature $T_w$ of the measurement window 102. The intensity $R_w$ intensity of black body radiation at temperature $T_w$ is a function of the temperature $T_w$ of the measurement window 102 and may be expressed as $R_w(T_w)$.

As illustrated in FIG. 3, the intensity of radiated light measured by the radiation thermometer 100 corresponds to the sum of the attenuated intensity of the radiated light emitted from the measuring object and the intensity of the radiated light from the measurement window 102. In a case where the transmittance of the measurement window 102 is adequately high, the transmittance of the measurement window may be approximately equal to one ($\tau_w \approx 1$), and the emissivity of the measurement window may be approximately equal to zero ($\tau_w \approx 0$). Accordingly, the intensity of radiated light measured by the radiation thermometer 100 may be substantially equal to the intensity of the radiated light from the measuring object. That is, in the case where the transmittance of the measurement window 102 is adequately high, the radiation thermometer 100 may accurately measure the temperature of the measuring object without being affected by variations in the temperature $T_w$ of the measurement window 102.

However, the measurement window 102 is exposed to plasma in the plasma processing apparatus 1. Therefore, a material that is resistant to plasma has to be selected for the measurement window 102. For this reason, restrictions are imposed on the materials that may be used for the measurement window 102, and it is rather difficult to select a material having adequate transparency as the material of the measurement window 102. Thus, the temperature measuring method according to the present embodiment relates to a method of accurately measuring the temperature of a measuring object by taking into account the variations in the temperature $T_w$ of the measurement window 102. In the temperature measuring method according to the present embodiment, the computer 150 corrects the temperature of the focus ring 18 measured by the radiation thermometer 100 according to the temperature of the measurement window 102. To perform such a correction, the computer 150 creates a model for performing the correction and defines a function f for the correction. In the following descriptions, the focus ring 18 is illustrated as an example of a member corresponding to the measuring object for temperature measurement according to the present embodiment.

(Model Creation)

Figure 4A:
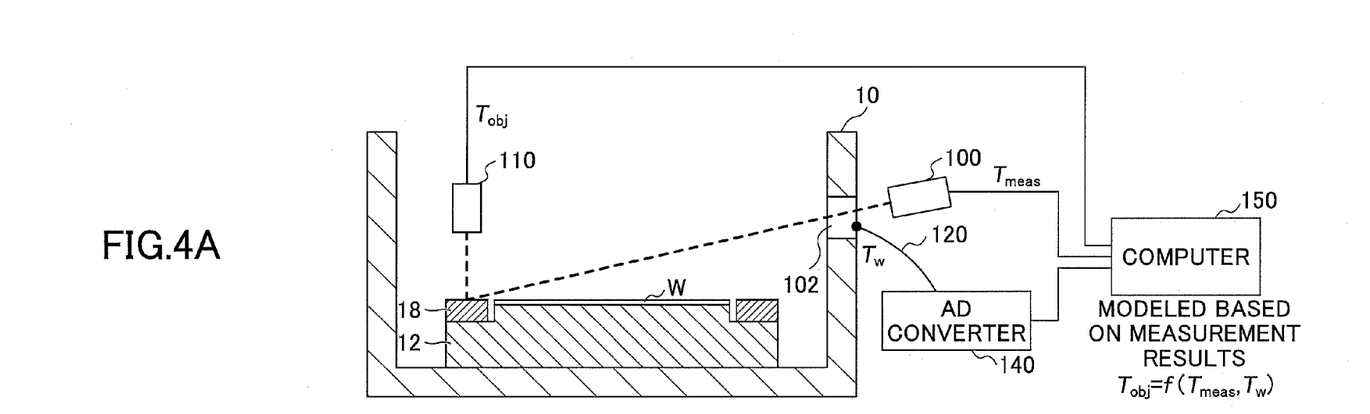
FIGS. 4A and 4B illustrate examples of temperature measurement processes performed upon model creation and during plasma processing according to an embodiment of the present invention.

FIG. 4A illustrates an exemplary temperature measurement process upon creating a model. As illustrated in FIG. 4A, at the model creation stage, the chamber 10 is exposed to the atmosphere, and three temperatures are measured in such a state. A first temperature of the temperatures measured corresponds to the temperature of the member corresponding to the measuring object that is measured without using the measurement window 102. Note that in the following descriptions, the temperature of the measuring object that has been measured without using the measurement window 102 is also referred to as "reference temperature $T_{obj}$". In the present example, the reference temperature $T_{obj}$ corresponds to the temperature of the focus ring 18 that is directly measured by a radiation thermometer 110 without using the measurement window 102. Note that the thermometer used for measuring the reference temperature $T_{obj}$ may be a radiation thermometer, a fluorescent thermometer, or some other type of thermometer. The thermometer may be a non-contact type or a contact type thermometer.

A second temperature of the temperatures measured corresponds to the temperature of the measuring object that is measured via the measurement window 102. In the following descriptions, the temperature of the measuring object that is measured via the measurement window 102 is also referred to as "correction target temperature $T_{meas}$". In the present example, the correction target temperature $T_{meas}$ corresponds to the temperature of the focus ring 18 that has been indirectly measured by the radiation thermometer 100 via the measurement window 102. Note that the thermometer used for measuring the correction target temperature $T_{meas}$ is a non-contact type thermometer.

A third temperature of the temperatures measured corresponds to the temperature $T_w$ of the measurement window 102. In the present example, the temperature $T_w$ of the measurement window 102 is measured using the thermocouple 120. The thermometer for measuring the measurement window 102 may be a radiation thermometer, or a fluorescent thermometer, for example. The thermometer may be a contact type or a non-contact type thermometer.

The computer 150 gathers measurement data and computes a function f for correcting the measurement data (modeling) in the following manner.

1. The radiation thermometer 110 measures the reference temperature $T_{obj}$ while the chamber 10 is open to the atmosphere. The reference temperature $T_{obj}$ is sent to the computer 150.

2. At the same time or in parallel with the above measurement 1, the radiation thermometer 100 measures the correction target temperature $T_{meas}$ of the focus ring 18. The correction target temperature $T_{meas}$ is sent to the computer 150.

3. Temperature control mechanisms arranged at the focus ring 18 and the outer wall of the chamber 10 are respectively used to adjust the temperature of the focus ring 18 and the temperature of the measurement window 102. The temperature of the focus ring 18 and the temperature of the measurement window 102 are adjusted using separate temperature control mechanisms. The radiation thermometers 100 and 110, and the thermocouple 120 repeatedly measure the correction target temperature $T_{meas}$ of the focus ring 18, the reference temperature $T_{obj}$ of the focus ring 18, and the temperature $T_w$ of the measurement window 102. The temperature $T_w$ of the measurement window 102 is converted from an analog signal to a digital signal by the AD converter 140 and sent to the computer 150.

4. The computer 150 stores the measured reference temperature $T_{obj}$, the measured correction target temperature $T_{meas}$, and the measured temperature $T_w$ of the measuring window 102 in a storage area such as a RAM.

5. The computer 150 recursively determines a function f where $T_{obj}=f(T_{meas}, T_w)$ based on measurement data of a plurality of sets of the stored temperature measurements (reference temperature $T_{obj}$, correction target temperature $T_{meas}$, measurement window temperature $T_w$). The function f is a model formula for correcting the correction target temperature $T_{meas}$ according to the measurement window temperature $T_w$ such that the correction target temperature $T_{meas}$ may be equal to or approximate the reference temperature $T_{obj}$. The function f may be determined based on the measurement data of the correction target temperature $T_{meas}$, the measurement window temperature $T_w$, and the reference temperature $T_{obj}$. In the following descriptions, a corrected temperature that is obtained by applying the function f to the correction target temperature $T_{meas}$ is referred to as "corrected temperature $T_{meas}'$". In other words, the relationship between the correction target temperature $T_{meas}$ (output of the radiation thermometer 100) and the corrected temperature $T_{meas}'$ may be expressed as follows.

$$T_{meas}'=f(T_{meas},T_w)$$

In the following, as an exemplary method of recursively calculating the function f, an example implementing multiple regression analysis using the least squares method is described. However, the method of recursively calculating the function f is not limited thereto and any known recursive calculation method including those listed below may be used.

Polynomial approximation model $$y=c+a1\times x1+b1\times x2+a2\times x1^2+b2\times x2^2+$$

Exponential approximation model $$y=c+a\times \exp(a'\times x1)+b\times \exp(b'\times x2)+$$

Logarithmic function approximation model $$y=c+a\times \log(x1)+b\times \log(x2)+$$

Neural Network Model

Figure 5A:
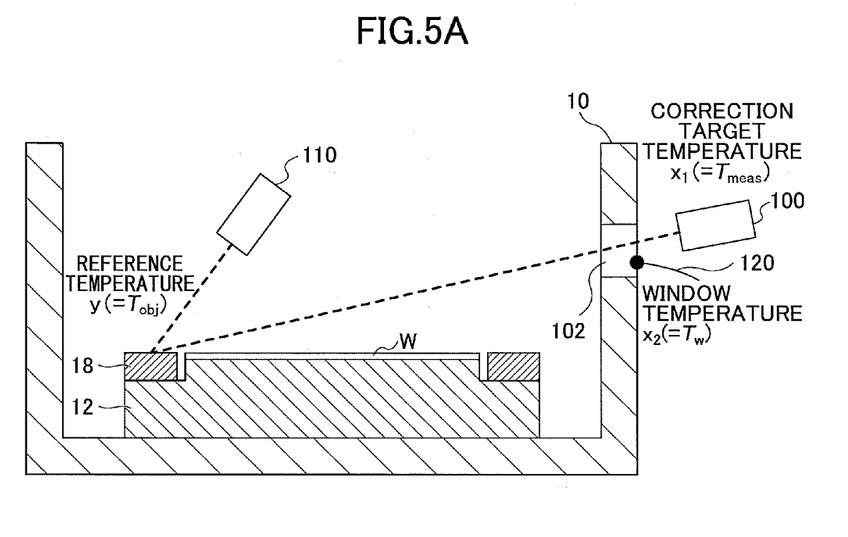
FIGS. 5A and 5B illustrate exemplary data used for regression analysis upon creating a model according to an embodiment of the present invention.
Figure 5B:
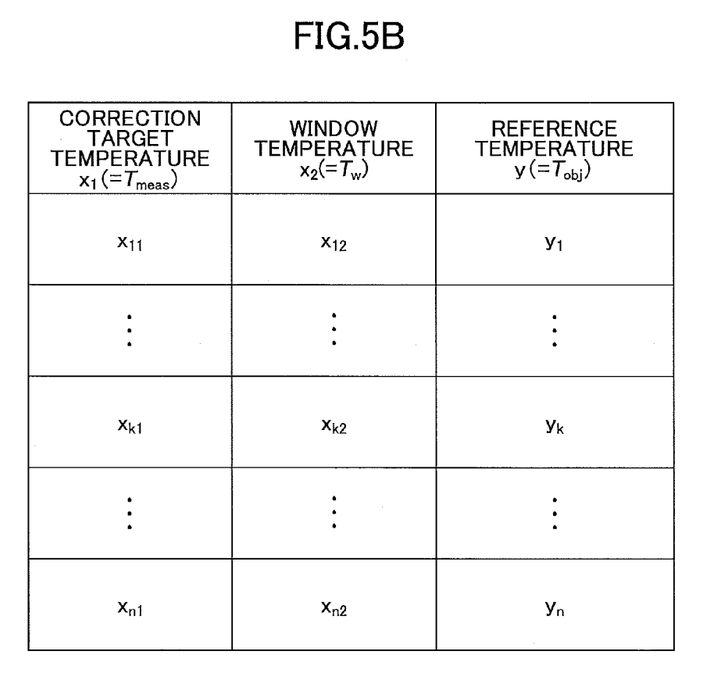

FIGS. 5A and 5B illustrate exemplary data used in recursive calculation for creating a model according to the present embodiment. As illustrated in FIG. 5A, in the following example, it is assumed that target variable y represents the reference temperature $T_{obj}$, variable $x_1$ represents the correction target temperature $T_{meas}$, and variable $x_2$ represents the measurement window temperature $T_w$. The computer 150 may compute the following regression formula (1) based on the measurement data of the three temperatures.

$$y = \beta_0 + \beta_1 x_1 + \beta_2 x_2 \quad (1)$$

In this case, using the least squares method, the coefficients $\beta_0$, $\beta_1$, $\beta_2$ of the above formula (1) may be calculated based on the following formulas (2)-(5). In the present example, it is assumed that n sets of measurement data of the three temperatures indicated in FIG. 5B are used for multiple regression analysis.

$$\begin{bmatrix} \beta_1 \\ \beta_2 \end{bmatrix} = \begin{bmatrix} S_{11} & S_{12} \\ S_{21} & S_{22} \end{bmatrix}^{-1} \begin{bmatrix} S_{1y} \\ S_{2y} \end{bmatrix} \quad (2)$$

$$\beta_0 = \bar{y} - \beta_1 \bar{x}_1 - \beta_2 \bar{x}_2 \quad (3)$$

$$S_{ij} = \sum_{k=1}^{n}(x_{ki} - \bar{x}_i)(x_{kj} - \bar{x}_j) \quad S_{iy} = \sum_{k=1}^{n}(x_{ki} - \bar{x}_i)(y_k - \bar{y}) \quad (4)$$

$$\bar{x}_i = \frac{1}{n}\sum_{k=1}^{n} x_{ki} \quad \bar{y} = \frac{1}{n}\sum_{k=1}^{n} y_k \quad (5)$$

The function f may be obtained by assigning the values calculated above to the coefficients $\beta_0$, $\beta_1$, $\beta_2$ in the above formula (1).

Example

Figure 6:
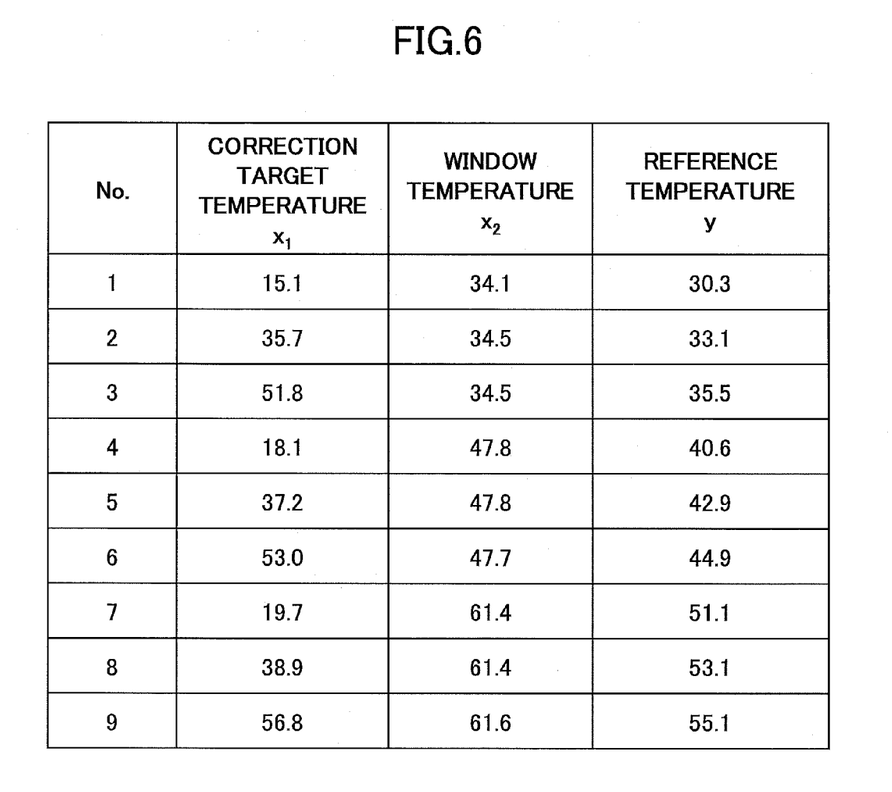
FIG. 6 illustrates a specific example of data used for regression analysis upon creating a model according to an embodiment of the present invention.

In the following, a specific example of recursively determining the function f is described with reference to FIG. 6. In the example described below, it is assumed that nine sets of measurement data of the three temperatures as indicated in FIG. 6 are used for multiple regression analysis. The computer 150 assigns the measured temperatures of the measurement data to the corresponding variables of the formulas 2)-(5) to obtain the coefficients $\beta_0$, $\beta_1$, $\beta_2$ of the formula (1). In the case where the nine sets of measurement data of the measured temperatures indicated in FIG. 6 are used, the following recursive formula may be obtained.

$$y = 3.93 + 0.12 x_1 + 0.72 x_2$$

By modifying the above formula, the following formula may be obtained.

$$x_1 = 8.30 y - 6.01 x_2 - 32.6$$

In this way, the function f may be obtained by assigning the calculated values to the coefficients $\beta_0$, $\beta_1$, $\beta_2$ in the formula (1).

That is, the function f may be expressed by the following formula (6).

$$f(T_{meas}, T_w) = -32.6 + 8.30 T_{meas} - 6.01 T_w \quad (6)$$

$T_{meas}$: correction target temperature; $T_w$: measurement window temperature.

(During Process)

When the radiation thermometer 100 measures the temperature of the focus ring 18 via the measurement window 102 while a process is performed, the computer 150 uses the function f to correct the measured correction target temperature $T_{meas}$ of the focus ring 18 according to the temperature $T_w$ of the measurement window 102. In this case, the computer 150 assigns the measured values to the correction target temperature $T_{meas}$ and the measurement window temperature $T_w$ in the formula representing the function f obtained in the above model creation stage to calculate the corrected temperature $T_{meas}'$. Note that the corrected temperature $T_{meas}'$ corresponds to the measured correction target temperature $T_{meas}$ that is corrected to be equal to or approximate the reference temperature $T_{obj}$. The corrected temperature $T_{meas}'$ may be obtained as follows based on the above formula (6).

$$T_{meas}' = f(T_{meas}, T_w)$$

Note that during a process, the reference temperature $T_{obj}$ may be set to a predetermined temperature of the focus ring 18 during processing that is prescribed in a recipe, for example. In such case, the corrected temperature $T_{meas}'$ that is obtained by applying the function f to the correction target temperature $T_{meas}$ may be equal to or approximate the predetermined temperature of the focus ring 18 during processing that is prescribed in the recipe (reference temperature $T_{obj}$). Note that a temperature control mechanism is arranged at the focus ring 18, and based on the corrected temperature $T_{meas}'$, the temperature control mechanism of the focus ring 18 may adjust the temperature of the focus ring 18 through heating and cooling such that the correction target temperature $T_{meas}$ may be equal to or approximate the predetermined temperature of the focus ring 18 prescribed in the recipe.

In the present embodiment, the computer 150 measures the correction target temperature $T_{meas}$ and computes the corrected temperature $T_{meas}'$ in the following manner.

Figure 4B:
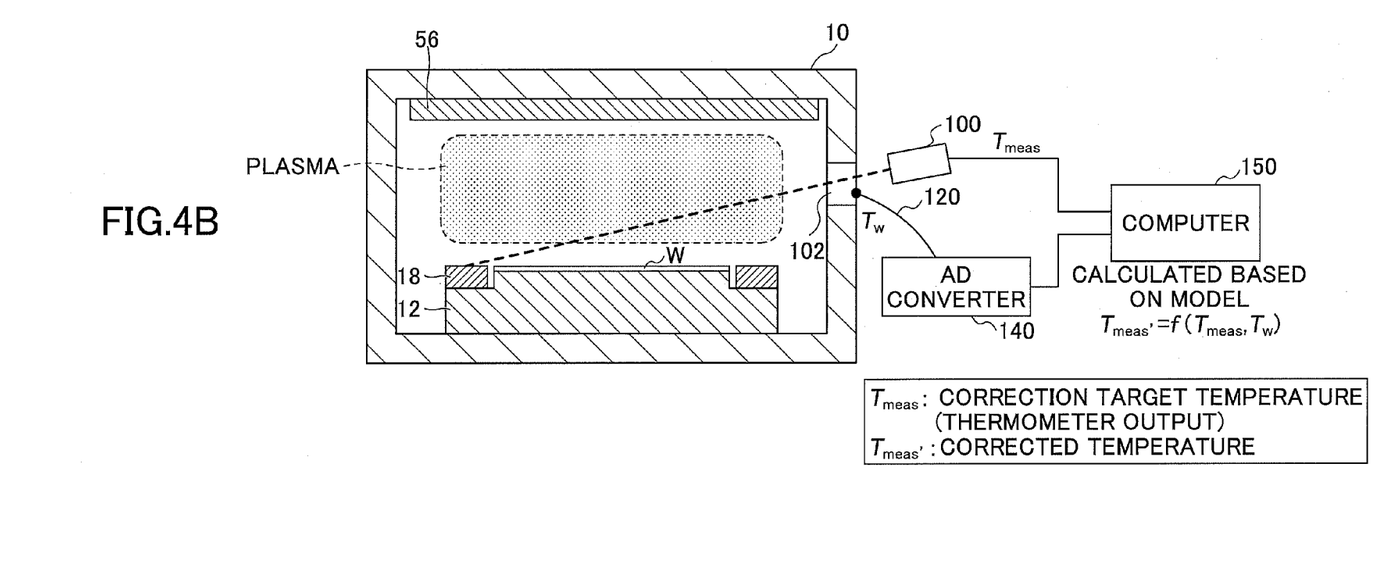

1. Before starting the process, the radiation thermometer 110 is removed and the pressure within the chamber 10 is reduced to vacuum as illustrated in FIG. 4B.

2. The computer 150 monitors the temperature $T_w$ of the measurement window 102. At the same time or in parallel, the computer 150 monitors the correction target temperature $T_{meas}$ of the focus ring 18 measured by the radiation thermometer 100 via the measurement window 102.

3. The computer 150 assigns the acquired temperature $T_w$ of the measurement window 102 and the correction target temperature $T_{meas}$ measured by the radiation thermometer 100 to the corresponding variables in the function f to calculate the corrected temperature $T_{meas}'$. In this way, the accuracy of the temperature of a member (measuring object) measured by the radiation thermometer 100 may be improved.

[Material of Measurement Window]

In one example, yttria ($Y_2O_3$) may be used in the measurement window 102. In this case, the measurement window 102 may include at least one layer made of yttria. That is, the measurement window 102 may be made of a bulk of yttria, or the measurement window 102 may be formed by coating a yttria thin film on an infrared light (radiated light) transparent material, for example. In other examples, the measurement window 102 may be made of calcium fluoride ($CaF_2$), sapphire, quartz, silicon, germanium, or any combination of the above materials.

[Effects]

As described above, a material with adequate plasma resistance has to be selected for the measurement window 102. Thus, when adequate transparency cannot be achieved in the measurement window 102 owing to the demand for a plasma resistant material, temperature measurements of the radiation thermometer 100 may be affected by variations in the temperature of the measurement window 102. Particularly, when measuring the temperature of a member arranged within the plasma processing apparatus 1, the temperature of the measurement window 102 is affected by heat input from plasma and varies depending on the number of wafers processed (processing time). As a result, the temperature of a member within the chamber 10 may not be accurately measured by the radiation thermometer 100 via the measurement window 102 while a plasma process is being performed, for example.

In view of the above, in a temperature measuring method according to the present embodiment, the temperature of the measurement window 102 is constantly measured. When the radiation thermometer 100 measures the correction target temperature $T_{meas}$ via the measurement window 102, the computer 150 assigns the acquired temperature $T_w$ of the measurement window 102 and the correction target temperature $T_{meas}$ to corresponding variables in the function f to calculate the corrected temperature $T_{meas}'$ corresponding to the corrected value of the correction target temperature $T_{meas}$. In this way, the correction target temperature $T_{meas}$ may be corrected to be equal to or approximate the reference temperature $T_{obj}$, and the accuracy of the measured temperature may be improved.

Figure 7A:
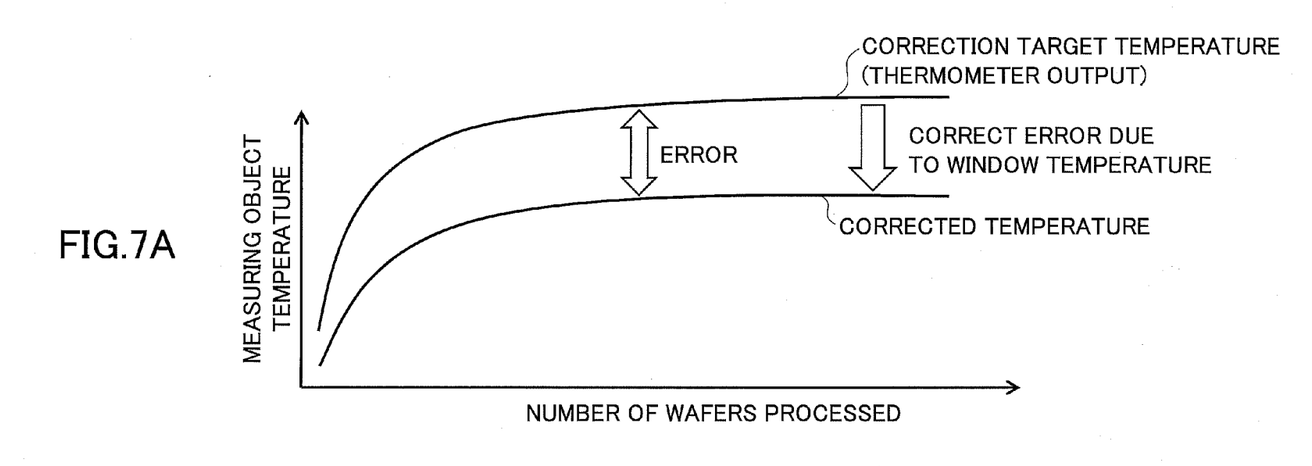
FIGS. 7A and 7B illustrate an exemplary effect achieved by a temperature measuring method according to an embodiment of the present invention.
Figure 7B:
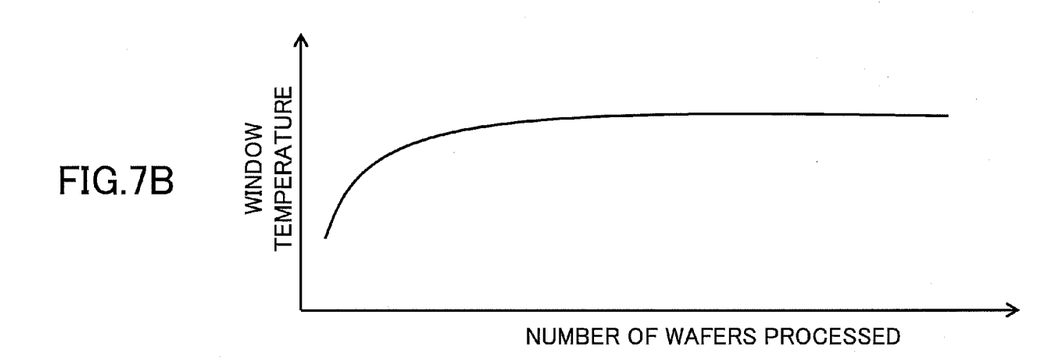

FIGS. 7A and 7B illustrate an exemplary effect achieved by the temperature measuring method according to the present embodiment. FIG. 7A is a graph including a curve representing an exemplary measurement of the correction target temperature $T_{meas}$ (radiation thermometer 100 output) that is measured via the measurement window 102 and a curve representing the corrected temperature $T_{meas}'$ of the correction target temperature $T_{meas}$. As can be appreciated, the correction target temperature $T_{meas}$ varies depending on the number of wafers processed. The corrected temperature $T_{meas}'$ is obtained by correcting the correction target temperature $T_{meas}$ according to the measurement window temperature $T_w$ based on a predetermined function f. FIG. 7B illustrates an exemplary measurement of the measurement window temperature $T_w$.

The correction target temperature $T_{meas}$ is corrected to remove the influences of variations in the temperature $T_w$ of the measurement window 102. Note that the curve representing the corrected temperature ($T_{meas}'$) in FIG. 7A is not obtained by simply shifting the curve representing the correction target temperature ($T_{meas}$) by a predetermined amount. That is, the correction target temperature $T_{meas}$ measured by the radiation thermometer 100 includes not only measurement errors specifically attributed to properties of the radiation thermometer 100, but also errors due to temperature variations of the measurement window 102 caused by heat input from plasma. The temperature $T_w$ of the measurement window 102 varies depending on the number of wafers processed. That is, the errors included in the correction target temperature $T_{meas}$ include errors based on variations in the temperature $T_w$ of the measuring window 102, and the errors based on variations in the temperature $T_w$ of the measurement window 102 change over time.

Thus, the variations in the correction target temperature $T_{meas}$ does not correspond to the variations in temperature $T_w$ of the measurement window 102. Therefore, in the temperature measuring method according to the present embodiment, the measurement errors included in the correction target temperature $T_{meas}$ which varies depending on the temperature $T_w$ of the measurement window 102, is corrected based on the function f. In this way, even in a case where the temperature $T_w$ of the measuring window 102 constantly changes, the temperature of a member corresponding to a measuring object arranged within the plasma processing apparatus 1 may be accurately measured according to the temperature $T_w$ of the measurement window 102.

Note that when plasma processing of wafers included in one lot of wafers is completed, for example, the chamber 10 may be reheated. Thus, the temperature $T_w$ of the measurement window 102 constantly changes. Accordingly, in a preferred embodiment, the correction target temperature $T_{meas}$ and the temperature $T_w$ of the measurement window 102 are constantly measured not only during processing but before and after processing and during transfer of the wafers, for example, and the correction target temperature $T_{meas}$ is constantly corrected using the function f.

(Model Creation: Modification)

In the embodiment described above, the focus ring 18 within the chamber 10 of the plasma processing apparatus 1 corresponds to the measuring object, and the plasma processing apparatus 1 is used to measure the temperature of the focus ring 18. However, in other embodiments, instead of actually using the plasma processing apparatus 1, a testing apparatus for model creation may be configured and such a testing apparatus may be used to create a model for temperature measurement of a measuring object.

Figure 8:
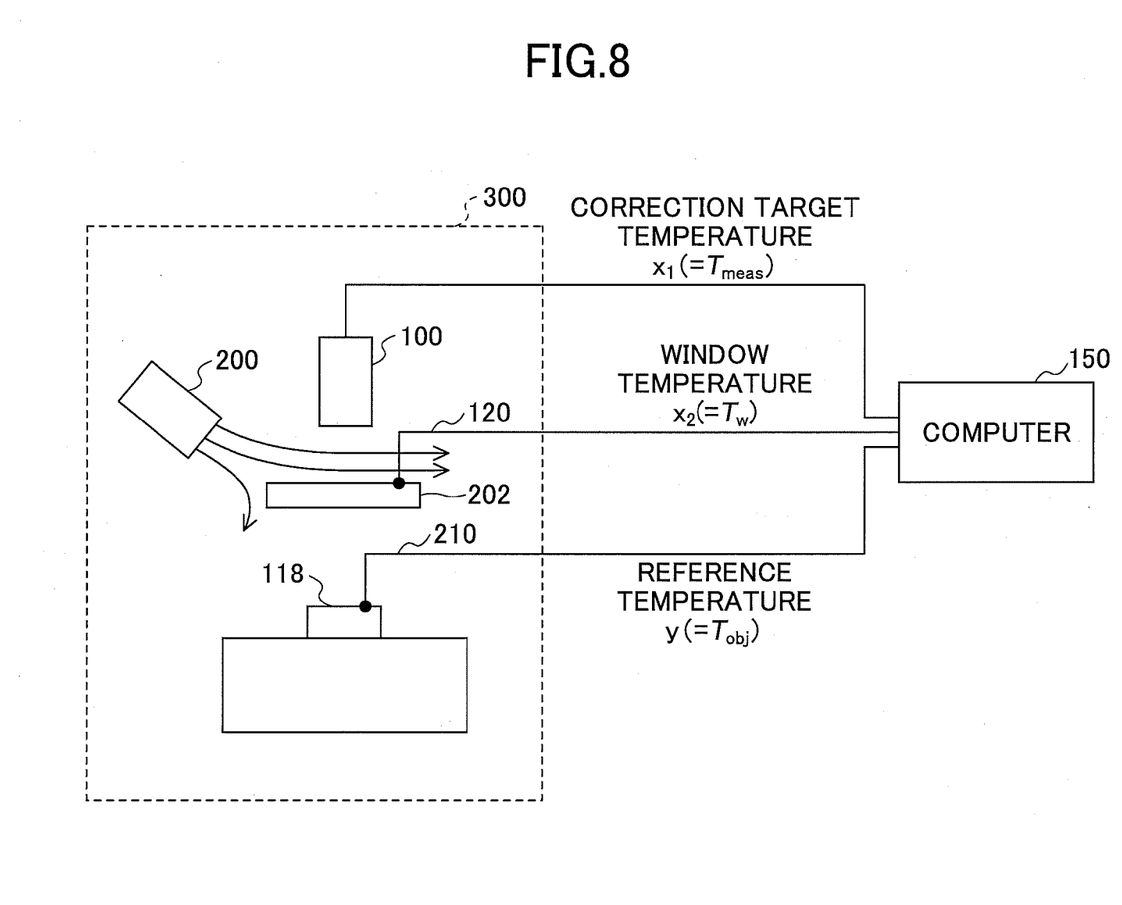
FIG. 8 illustrates an exemplary testing apparatus used upon creating a model according to an embodiment of the present invention.

FIG. 8 illustrates a testing apparatus 300 for creating a model according to a modified example. The testing apparatus 300 of FIG. 8 includes the radiation thermometer 100, a simplified window 202 made of yttrium, the thermocouple 120 that is connected to the window 202, a material sample 118 corresponding to a measuring object that is arranged on a stage, a thermocouple 210 that is connected to the material sample 118, and a heat gun 200 for adjusting the temperature of the window 202. The heat gun 200 is an example of a temperature control mechanism for adjusting the temperature of the window 202. The thermocouple 120 and the thermocouple 210 are configured to measure the temperatures of the window 202 and the material sample 118, respectively.

In the present modified example, the simplified testing apparatus 300 as described above is used to measure the reference temperature y ($=T_{obj}$), the correction target temperature $x_1$ ($=T_{meas}$ (output of the radiation thermometer 100)), and the window temperature $x_2$ ($=T_w$). The computer 150 recursively calculates the function f defined by $T_{obj}$=f ($T_{meas}$, $T_w$) based on a plurality of sets of measurement data obtained by the testing apparatus 300.

By using such a simplified testing apparatus 300, a model for correcting a temperature measurement may be created even when the actual plasma processing apparatus 1 in which the member corresponding to the measuring object is arranged does not include the measurement window 102 or a temperature control mechanism for controlling the temperature of the member corresponding to the measuring object.

[Application]

Figure 9:
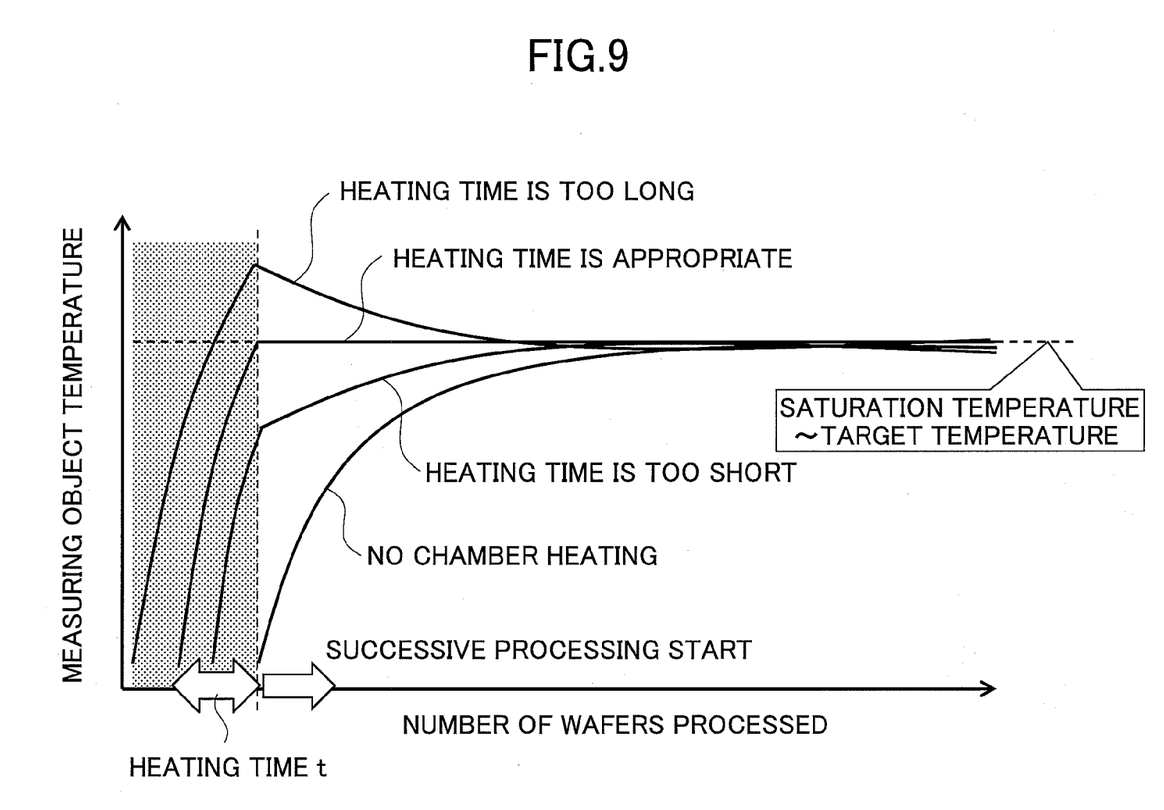
FIG. 9 illustrates an example of applying a temperature measuring method according to an embodiment of the present invention to endpoint detection of a heating process.

In the following, an exemplary application of the temperature measuring method according to the present embodiment is described with reference to FIG. 9. As illustrated in FIG. 9, owing to heat input from plasma, the temperature of a member corresponding to a measuring object gradually changes according to the number of wafers processed. Accordingly, a plasma is preferably generated in the plasma processing apparatus 1 prior to wafer processing and the member corresponding to the measuring object is pre-heated by the plasma so that variations in the temperature of the measuring object during wafer processing may be minimized.

In this case, when the temperature of the member corresponding to the measuring object cannot be accurately measured, the appropriate amount of time the chamber 10 should be heated by the plasma (heating time t) to minimize variations in the temperature of the measuring object cannot be properly calculated.

In this respect, by implementing the temperature measuring method according to the present embodiment, the temperature of the measuring object may be corrected in real time. Accordingly, the heating time t for heating the wafer W prior to plasma processing may be accurately calculated. That is, the temperature measuring method according to the present embodiment can be used to detect an endpoint for heating the member corresponding to the measuring object.

Specifically, a saturation temperature of the measuring object that is generally unlikely to fluctuate may be preset as a target temperature. The saturation temperature may be set to a target temperature determined by the plasma processing apparatus 1 upon processing a previous lot of wafers, for example. The saturation temperature may be set to a temperature during processing or before/after processing of a plasma process performed on the previous lot by the plasma processing apparatus 1, for example.

For example, when the corrected temperature $T_{meas}'$ corresponding to the correction target temperature $T_{meas}$ that is corrected by the function f reaches a target temperature corresponding to a temperature during processing or before/after processing of a last wafer of a previous lot of wafers processed by the plasma processing apparatus 1, the control unit 80 may determine that the temperature of the measuring object has reached the saturation temperature and control the plasma processing apparatus 1 to start processing a present lot of wafers.

As described above, the temperature measuring method according to the present embodiment can be used to determine the heating time t for heating the interior of the chamber 10 with plasma before starting a plasma process. Note, however, that application of the temperature measuring method according to the present embodiment is not limited to the above example. That is, the present invention can generally be applied to any temperature correction to be implemented upon measuring the temperature of a member of the plasma processing apparatus 1 via the measurement window 102.

[Measuring Object]

In the following, examples of members that may be measuring objects of the temperature measuring method according to the present embodiment are described. In the embodiment described above, the focus ring 18 is illustrated as an example of a measuring object. Temperature adjustment of the focus ring 18 is important because temperature variations in the focus ring 18 may have a substantial impact on processing results of processing a peripheral portion of the wafer W. Thus, by controlling the temperature of the focus ring 18 to a constant temperature using the temperature measuring method according to the present embodiment, favorable plasma processing results may be obtained upon processing the wafer W, for example.

Figure 10A:
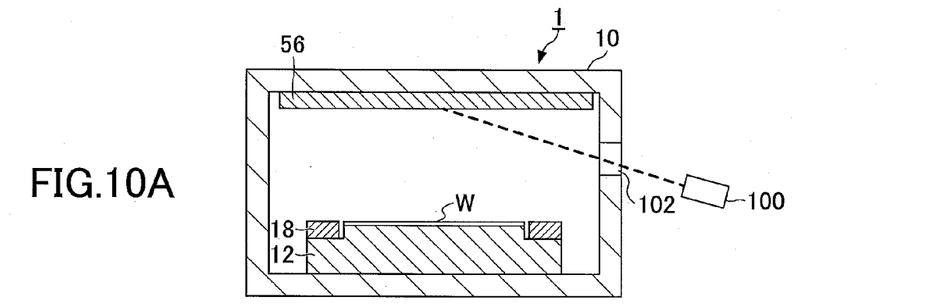
FIGS. 10A-10D illustrate examples of members corresponding to measuring objects according to embodiments of the present invention.
Figure 10B:
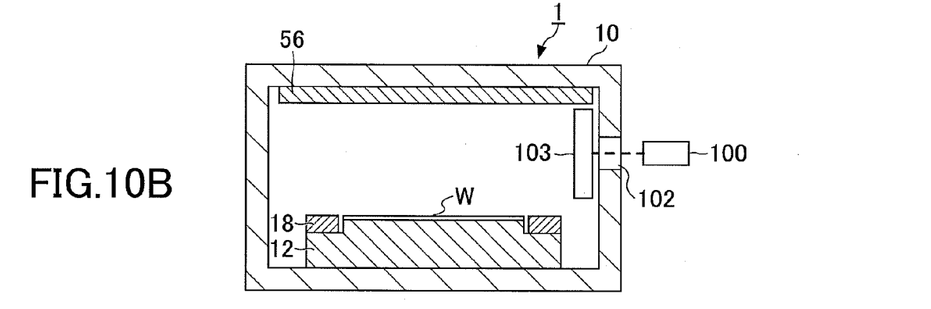

Note, however, that a member corresponding to a measuring object of the temperature measuring method according to the present embodiment is not limited to the above. For example, the electrode plate 56 arranged on the ceiling portion of the chamber 10 as illustrated in FIG. 10A may correspond to the measuring object. Also, a liner 103 arranged near an inner wall portion of the chamber 10 to prevent corrosion of the inner wall of the chamber 10 as illustrated in FIG. 10B may correspond to the measuring object. Also, the mounting table 12 (electrostatic chuck) or some other member of the plasma processing apparatus 1 may correspond to the measuring object.

Figure 10C:
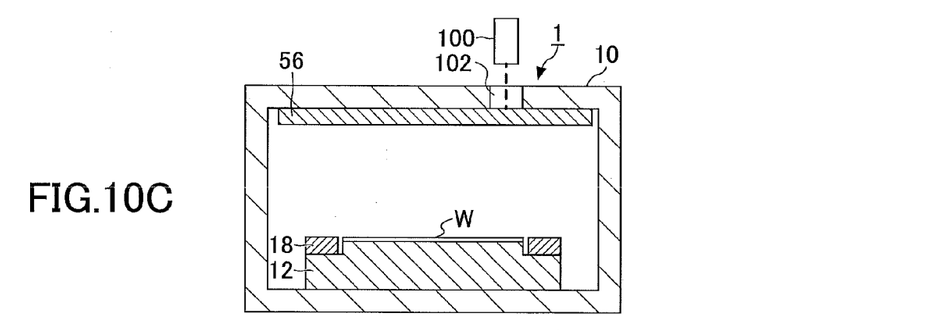

As illustrated in FIG. 10C, in some embodiments, the measurement window 102 may be arranged at a ceiling portion of the chamber 10. In this case, the radiation thermometer 100 can measure a ceiling side temperature of the electrode plate 56. The temperature of the electrode plate 56 measured by the radiation thermometer 100 may be corrected by the function f in this case as well.

Figure 10D:
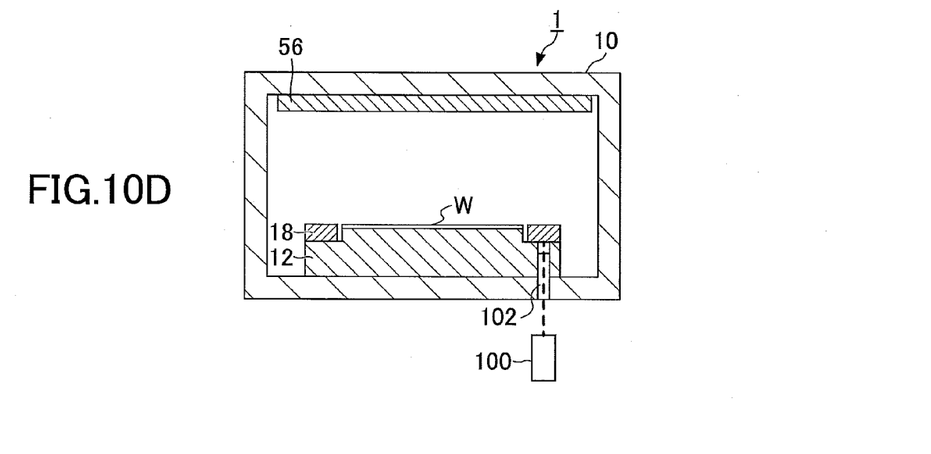

As illustrated in FIG. 10D, in some embodiments, the measurement window 102 may be arranged to penetrate through the chamber 10 and the mounting table 12 at the bottom side of the chamber 10. In this case, the radiation thermometer 100 can measure a bottom side temperature of the focus ring 18. The temperature of the focus ring 18 measured by the radiation thermometer 100 may be corrected by the function f in this case as well.

In the temperature measuring method and the plasma processing system 2 according to the embodiments described above, the temperature of a member corresponding to a measuring object arranged in the plasma processing apparatus 1 can be accurately measured via the measurement window 102. Also, by constantly monitoring the temperatures of the measuring object within the chamber 10 and the measurement window 102 during plasma processing and correcting the measured temperature of the member corresponding to the measuring object, temperature variations may be controlled upon repeatedly performing a wafer process. In this way, plasma processing may be effectively performed on a wafer.

Although illustrative embodiments of a temperature measuring method and a plasma processing system according to the present invention have been described above with reference to the accompanying drawings, the present invention is not limited to these embodiments. That is, numerous variations and modifications will readily occur to those skilled in the art, and the present invention includes all such variations and modifications that may be made without departing from the scope of the present invention.

For example, in the above-described embodiments, the corrected temperature $T_{meas}'$ is calculated as $T_{meas}'=f(T_{meas}, T_w)$ based the above formula (6). That is, the function f includes the correction target temperature $T_{meas}$ and the measurement window temperature $T_w$ as variables. However, the above method of calculating the corrected temperature $T_{meas}'$ is merely one example. That is, the function f may include other variables as long as it includes the correction target temperature $T_{meas}$ and the measurement window temperature $T_w$ as variables. For example, an environmental temperature $T_{env}$ may be taken into account, and the function f may include the correction target temperature $T_{meas}$, the measurement window temperature $T_w$, and the environmental temperature $T_{env}$ as variables to be recursively defined as $f(T_{meas}, T_w, T_{env})$.

Also, a plasma processing apparatus according to the present invention may be any apparatus that utilizes the action of plasma including an etching apparatus, a film deposition apparatus, an ashing apparatus, and a cleaning apparatus, for example. Also, examples of means used by the plasma processing apparatus to generate a plasma may include a capacitively coupled plasma (CCP) generating unit, an inductively coupled plasma (ICP) generating unit, a helicon wave plasma (HWP) generating unit, a microwave surface wave plasma generating unit for generating a microwave plasma such as a slot plane antenna (SPA) plasma or a microwave plasma generated from a radial line slot antenna, an electron cyclotron resonance plasma (ECR) generating unit, a remote plasma generating unit using the above plasma generating units, and the like.

Also, note that when a thermometer is arranged within the chamber of a plasma processing apparatus, the thermometer may be affected by high frequency waves and microwaves and may be exposed to plasma, for example. As a result, the thermometer may be prone to breakdown, and the interior of the chamber may be contaminated by the thermometer. In view of the above, in the temperature measuring method according to the present invention, the temperature of a member within the chamber corresponding to a measuring object is measured from outside the chamber via a measurement window. In this way, breakdown of the thermometer and/or contamination of the chamber may be avoided, for example. Also, manufacturing costs may be reasonably low.

Also, in the above-described embodiments, modeling (model creation) and temperature correction are performed by the computer 150. However, the present invention is not limited thereto, and in other embodiments, a part or all of the modelling and temperature correction processes may be performed by the control unit 80, for example. Although the computer 150 and the control unit 80 are configured as separate units in the above-described embodiments, they may also be integrated into one unit, for example.

Also, a workpiece that is subject to a plasma process in the present invention is not limited to a semiconductor wafer but may be a large substrate for a flat panel display (FPD), an electroluminescence (EL) element, or a substrate for a solar battery, for example.

The present application is based on and claims the benefit of priority of Japanese Patent Application No. 2014-019634 filed on Feb. 4, 2014, the entire contents of which are herein incorporated by reference.

What is claimed is:

1. A temperature measuring method for measuring a temperature of a member corresponding to a measuring object arranged within a chamber of a plasma processing apparatus, the temperature measuring method comprising:

a function obtaining step of obtaining a function (f) for correcting a correction target temperature ($T_{meas}$) according to a measurement window temperature ($T_w$), the function (f) being computed based on the correction target temperature ($T_{meas}$) corresponding to a temperature of the measuring object measured via a measurement window arranged at the chamber, a reference temperature ($T_{obj}$) corresponding to a temperature of the measuring object measured without using the measurement window, and the measurement window temperature ($T_w$) corresponding to a temperature of the measurement window;

a first measuring step of measuring the correction target temperature ($T_{meas}$);

a second measuring step of measuring the measurement window temperature ($T_w$);

a correction step of correcting the correction target temperature ($T_{meas}$) measured in the first measuring step according to the measurement window temperature ($T_w$) measured in the second measuring step based on the obtained function (f), and a step of repetitively measuring the correction tarp et temperature ($T_{meas}$) and the measurement window temperature ($T_w$), and repetitively correcting the measured correction target temperature ($T_{meas}$) using the function (f) and the measured measurement window temperature ($T_w$) until a corrected temperature ($T_{meas}'$) corresponding to a temperature of the measuring object corrected by the correction step reaches a target temperature corresponding to a temperature during processing or before/after processing of a previous plasma process performed on a previous lot by the plasma processing apparatus.

2. The temperature measuring method as claimed in claim 1, wherein the member corresponding to the measuring object arranged within the chamber of the plasma processing apparatus is at least one of a focus ring, a ceiling member, and a liner.

3. The temperature measuring method as claimed in claim 1, wherein the measurement window is made of at least one of yttria ($Y_2O_3$), calcium fluoride ($CaF_2$), sapphire, quartz, silicon, and germanium.

4. The temperature measuring method as claimed in claim 1, wherein the temperature of the measurement window is measured by a thermocouple attached to the measurement window.

* * * * *